US005281932A

United States Patent [19]

Even-Or

[11] Patent Number: 5,281,932

[45] Date of Patent: Jan. 25, 1994

[54] MULTILAYER MAGNETICALLY COUPLED SUSPENDED STRIPLINE FOR IMPEDANCE MATCHING

[75] Inventor: Baruch Even-Or, Chalfont, Pa.

[73] Assignee: AEL Defense Corp., Lansdale, Pa.

[21] Appl. No.: 941,774

[22] Filed: Sep. 4, 1992

Related U.S. Application Data

[63] Continuation of Ser. No. 680,220, Apr. 4, 1991, abandoned.

[51] Int. Cl.[5] .................. H03H 11/28

[52] U.S. Cl. .................. 333/32; 333/33; 343/861

[58] Field of Search .................. 333/32, 33, 17.3; 343/860-862

[56] References Cited

U.S. PATENT DOCUMENTS

| | | | |
|---|---|---|---|
| 2,756,414 | 7/1956 | Doremus | 333/32 X |
| 3,662,294 | 5/1972 | Jacobs et al. | 333/33 |
| 3,965,445 | 6/1976 | Ou | 333/33 |
| 3,990,024 | 11/1976 | Hou | 333/33 |
| 4,095,198 | 6/1978 | Kirby | 333/32 |
| 4,350,958 | 9/1982 | Pagnamenta | 333/33 |
| 4,479,100 | 10/1984 | Moghe et al. | 333/33 |
| 4,558,285 | 12/1985 | Shrestha et al. | 333/32 |
| 5,015,972 | 5/1991 | Cygan et al. | 333/33 X |

FOREIGN PATENT DOCUMENTS

| | | | |
|---|---|---|---|
| 318310 | 12/1989 | Japan | 333/32 |

OTHER PUBLICATIONS

Technical Proposal 18839.0000, of AEL Defense Corp., entitled "Frequency Agile Solid-State Power Amplifer," dated Nov. 1988.

Technical Proposal 18542.0001, of AEL Defense Corp., entitled "Frequency Agile HF Antenna Coupler," dated Nov. 1989.

Technical Proposal 18121.0002, of AEL Defense Corp., entitled "Frequency-Agile HF Antenna," dated Jul. 1990.

*Primary Examiner*—Benny Lee

*Attorney, Agent, or Firm*—Seidel, Gonda, Lavorgna & Monaco

[57] ABSTRACT

An impedance matching device that is particularly suited for high speed, high power applications is disclosed. The impedance matching devices employ magnetic coupling allowing their usage in a "frequency-agile" environments such as communication as well as communication jamming and deception techniques without creating high current, high voltage and thermal conditions that might otherwise damage the related switching devices. The impedance matching device provides a predetermined impedance to transform a load impedance $Z_L$ into a desired characteristic impedance $Z_0$ over a frequency range having a lower and an upper band. The device comprises one or more first and second inductive components. Each of the first inductive components has an impedance characteristic associated with said lower band, whereas each of the second inductive component has an impedance characteristic associated with the upper band. The device further comprises switch means having an active and an inactive state and being of a predetermined number at least equal to the predetermined number of second components. Each of the switch means in its active state bypassing its corresponding second component and effectively shorting out its respective first component.

6 Claims, 8 Drawing Sheets

FIG. 1 (a) π SECTION
PRIOR ART

FIG. 1 (b) T SECTION
PRIOR ART

MULTILAYER MAGNETICALLY COUPLED SUSPENDED STRIPLINE FOR IMPEDANCE MATCHING

This is a continuation of parent application, Ser. No. 07/680,220 filed on Apr. 4, 1991, now abandoned.

FIELD OF THE INVENTION

The present invention is directed to a device for high power and high speed impedance matching. The invention is directly applicably to antenna couplers, tunable filters and other variable impedance matching requirements, and broadly applicable to all impedance matching requirements. The present invention is particularly suited for electronics warfare (EW) systems used for jamming and deception of "frequency agile" communication and guidance links, as well as "frequency agile" communication systems.

BACKGROUND OF THE INVENTION

Traditional impedance matching devices are usually based on either the "$\pi$" network or the "T" network, both of which are well known electronic circuits, and which are illustrated in FIGS. 1(*a*) and 1(*b*), respectively.

In the $\pi$ network of FIG. 1(*a*) (so called because the network diagram resembles the Greek letter $\pi$), impedance matching is achieved by a single series impedance Z2 and two parallel impedances Z1 and Z3 to ground, one located at the input and one located at the output of Z2. Typically, series impedance Z2 is modelled as an inductor L, while parallel impedances Z1 and Z2 are modelled as capacitors $C_1$ and $C_2$, respectively. The impedances may be fixed, but it is usually preferred that they be variable in order to give the circuit a range in frequencies over which the impedances may be matched. Thus, the $\pi$ network of FIG. 1(*a*) is illustrated as comprising a series impedance in the form of a variable inductor and parallel impedances in the form of variable capacitors.

In the T network (so called because it resembles the letter T), impedance matching is achieved by using two series impedances Z1 and Z3 and a single parallel impedance Z2 to ground located at the node between Z1 and Z3. In the T network, the series impedances are also modelled as variable inductors L, and $L_2$ and the parallel impedance as a variable capacitor, as illustrated in FIG. 1(*b*).

The $\pi$ and T networks form the building blocks for most conventional impedance matching circuits. They are well understood, can be modelled using existing computer-aided design methods, and can be used to form other, more complex impedance matching circuits. Although used in many conventional antenna coupler configurations, the $\pi$ and T matching sections present certain drawbacks for applications, such as an antenna coupler.

If large magnitude impedance transformations are required, it is possible to develop extremely high RF potentials on one or more of the matching networks. For this reason it is often necessary to, in the case of a $\pi$ section device, choose a capacitor or switch, for example, capable of withstanding voltages in excess of 10,000 volts. In some cases, this voltage can ionize the air and cause a shorting path. For this reason, vacuum capacitors and relays such as those manufactured by the Jennings Corporation are often used. Solid state circuits matching circuits based on a $\pi$ or T configuration can expose the solid state switches to extreme current and voltage conditions especially when attempting to match a "short antenna" at the low end of the HF frequency range (HF is typically 2 to 30 MHz). For example, when using a $\pi$ section for matching to a 15 foot monopole antenna, a current as high as 10 amperes may flow through the inductor $Z_2$, when attempting to transmit 1 to 2 kw power due to the typical impedance of this antenna varying from 0.5−j 900 ohms at 2 MHz to 400+j 500 ohms at 15 MHz. The inductor of the matching network may be shorted-out during a portion of this frequency range in order to obtain the needed impedance matching which, in turn, may cause its related solid state switch to experience a current as high as 20 amperes for this short duration. Furthermore, the voltage across the inductor at the 2 megahertz frequency may be in excess of 10 KV, and unless each turn forming the inductor is switched separately, the required voltage rating for the solid state switches, in their off-state, may be substantially over 1 KV. These high current and voltage conditions caused by the $\pi$ as well as the T matching sections impose high stress on the solid state devices. Also, because it is desired to mount the switches in close proximity to the inductor for high frequency applications in order to overcome the disadvantages of switch lead inductance, a serious thermal problem may arise because of the heat transferred from the inductor to the solid-state switch. These high voltage, current, and thermal conditions may contribute to the premature failure of the solid state devices.

There is a need for an impedance matching device that overcomes the drawbacks of the conventional impedance matching $\pi$ or T circuits. In particular, there is a need for an impedance matching device that reduces or even eliminates the high voltage stresses that are placed on the switches used at high power and high frequency applications to prevent the use of semiconductor switches such as diodes or the switch described in U.S. Pat. No. 4,808,859. Further, the impedance matching device should perform over a wide range of frequencies so that the related antenna or other device can be properly matched to the desired impedance.

In addition to overcoming the drawbacks of the $\pi$ and T matching sections, there is a need to minimize the number of solid state switches associated with impedance matching devices. The numbers of switch devices are directly related to the number of switchable segments of the matching sections, wherein one switching device operatively connects or disconnects a corresponding switchable segment. It is desired that means be provided to reduce the number of switching devices needed for impedance matching devices.

Accordingly, it is an object of the present invention to provide impedance matching devices that reduce the number of switching devices, especially for high power and high frequency applications.

It is another object of the present invention to provide impedance matching devices that overcome the drawbacks of conventional impedance matching $\pi$ or T circuits related to the high current, voltage and thermal stress conditions of the switching devices.

SUMMARY OF THE INVENTION

The present invention is directed to a device that is particularly suited for providing high power and high speed impedance matching and which translate the stress conditions on the related switching devices to values that can be managed. The impedance matching device provides a variable impedance over a frequency range having a lower and an upper band, and which transforms a high, unpredictable, or changing load impedance $Z_L$ into a desired source impedance $Z_0$ for maximum power transfer. The impedance matching device comprises one or more first planar coupled inductive components, one or more second planar inductive components, and one or more switch means each with an active and an inactive state. Each of the one or more switch means is operatively connected to a corresponding second component and the number of such switch means equals at least the number of second components. The one or more second components can each have a predetermined impedance characteristic related to the frequency range. Each of the second components faces and is spaced apart from a respective second component. The first and second respective components are magnetically and electrically coupled to each other. Each of the switch means in its active state causes its corresponding second component to be "bypassed" and also effectively shorts out the respective first component.

DESCRIPTION OF THE DRAWINGS

For the purpose of illustrating the invention, there is shown in the drawings a form which is presently preferred; it being understood, however, that this invention is not limited to the precise arrangements and instrumentalities shown.

DESCRIPTION OF THE PREFERRED EMBODIMENTS

The present invention relates to an improved impedance matching device as well as various circuit arrangements that are particularly suited for high power and high frequency applications. The present invention provides for impedance matching and utilizes a variable length transmission line (VTL) technique. The present invention may be more fully appreciated by first describing the basic principle of the variable length transmission line (VTL) illustrated in FIG. 2.

Figure 1:
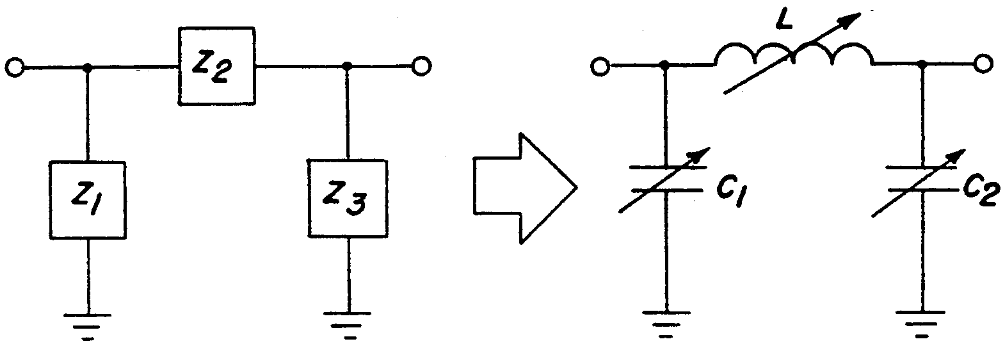
FIG. 1 PRIOR ART
FIGS. 1(*a*) and 1(*b*) respectively illustrate the prior art $\pi$ and T impedance matching circuits already described with reference to the "Background".
Figure 1:
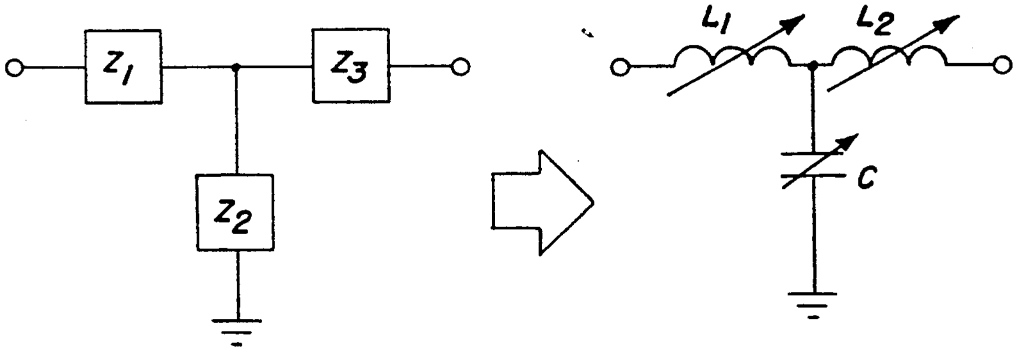
FIG. 1 PRIOR ART
Figure 2:
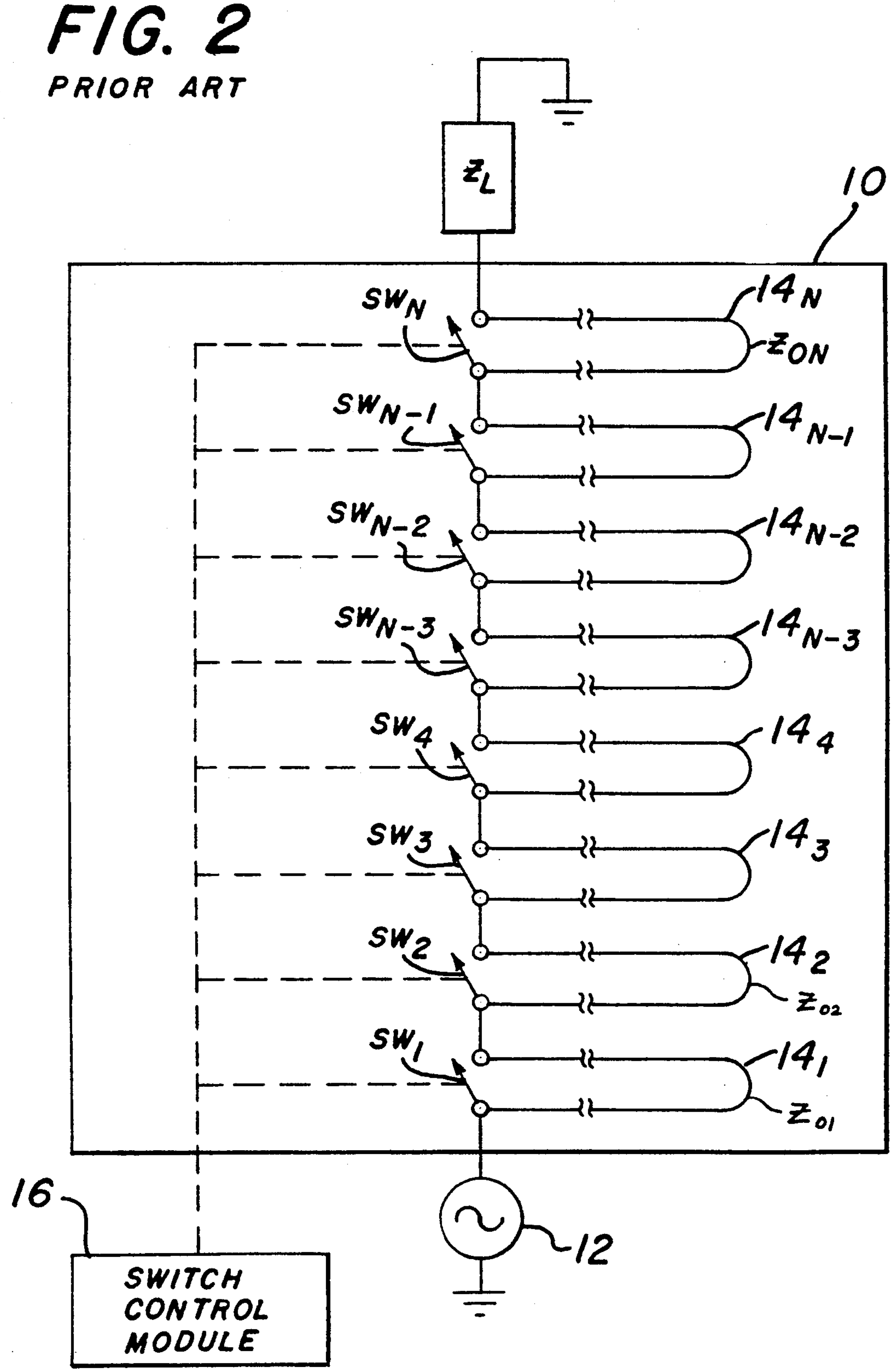
FIG. 2 PRIOR ART
FIG. 2 illustrates the basic principle of a prior art variable-length transmission line (VTL) used for impedance matching applications.

FIG. 2 illustrates the imposition of an impedance matching arrangement 10 between a source of excitation 12 and a load impedance $Z_L$. The source 12 may be of the type discussed with regard to the "Background" and is of a known frequency, typically but not limited to the frequency range from 2 to 30 megahertz (MHz), but it can be scaled in frequency to any desired frequency range. The source 12 is of a relatively high power, typically of several kilowatts (kW). The impedance $Z_L$ may represent that of a "short" antenna which is operated over the 2–30 MHz frequency range but it can be "any" arbitrary antenna or other device impedance. The circuit arrangement 10 transforms the impedance $Z_L$ into a desired characteristic impedance $Z_O$ so that the power of the source 12 may be substantially absorbed by the load impedance. The circuit 10 comprises a plurality of impedance line segments $\mathbf{14}_1$, $\mathbf{14}_2$, $\mathbf{14}_3$, $\mathbf{14}_4$, $\mathbf{14}_{N\text{-}3}$, $\mathbf{14}_{N\text{-}2}$, $\mathbf{14}_{N\text{-}1}$ and $\mathbf{14}_N$, each having a respective characteristic impedance $Z_{01}$, $Z_{02}$, . . . $Z_{0N}$, and each respectively operatively connected by a switch $SW_1$, $SW_2$, $SW_3$, $SW_4$, $SW_{N\text{-}3}$, $SW_{N\text{-}3}$, $SW_{N\text{-}1}$ and $SW_N$ arranged as shown in FIG. 2. The symbol illustrating a broken line for segments $\mathbf{14}_1$ . . . $\mathbf{14}_N$ is used in FIG. 2 to indicate that the line length of these segments is a selectable design parameter. This broken line symbol is used in other Figures to indicate the same function. The switches $SW_1$, $SW_2$, . . . $SW_N$ of FIG. 2 are operatively responsive to a switch control module 16 which selectably closes one or more switches $SW_1$, . . . $SW_N$ according to a preselected program which provides for desired impedance matching values that accommodate various load impedances $Z_L$.

FIG. 2 illustrates the basic principle of the variable-length transmission line (VTL) whose overall line length is controlled by the operation of the switches $SW_1$, . . . $SW_N$ connecting or disconnecting respective segments $\mathbf{14}_1$, . . . $\mathbf{14}_N$. Each of the switches $SW_1$, . . . $SW_N$ has an active state which shorts-out the transmission sections $\mathbf{14}_1$, $\mathbf{14}_N$, respectively, and in its inactive state allows the respective transmission section $\mathbf{14}_1$, . . . $\mathbf{14}_N$ to be selectively interposed between $Z_L$ and the source 12. The length of the transmission line interposed, that is connected between source 12 and $Z_L$ may vary from a "zero length", commonly referred to as $l_{min}$, to a maximum length, commonly referred to as $l_{max}$ The zero length is provided when all of the switches $SW_1$, . . . $SW_N$ are in their active states so as to short out all of the respective transmission line $\mathbf{14}_1$, . . . $\mathbf{14}_N$, whereas, the $l_{max}$ is realized when all of the switches $SW_1$, . . . $SW_N$ are in their inactive state so as to serially interpose all of the line segments $\mathbf{14}_1$, . . . $\mathbf{14}_N$ between the source 12 and the load $Z_L$. The incremental changes, that may be realized in the length of the variable transmission line $\mathbf{14}_1$, . . . $\mathbf{14}_N$ are directly dependent upon the number of transmission lines $\mathbf{14}_1$, . . . $\mathbf{14}_N$ and the number of switches $SW_1$, . . . $SW_N$ that are employed. The present invention reduces the number of switches ($SW_K$ . . . $SW_N$) by a factor of at least about one-half while still providing the desired impedance matching achievable by the arrangement of FIG. 2.

Figure 3:
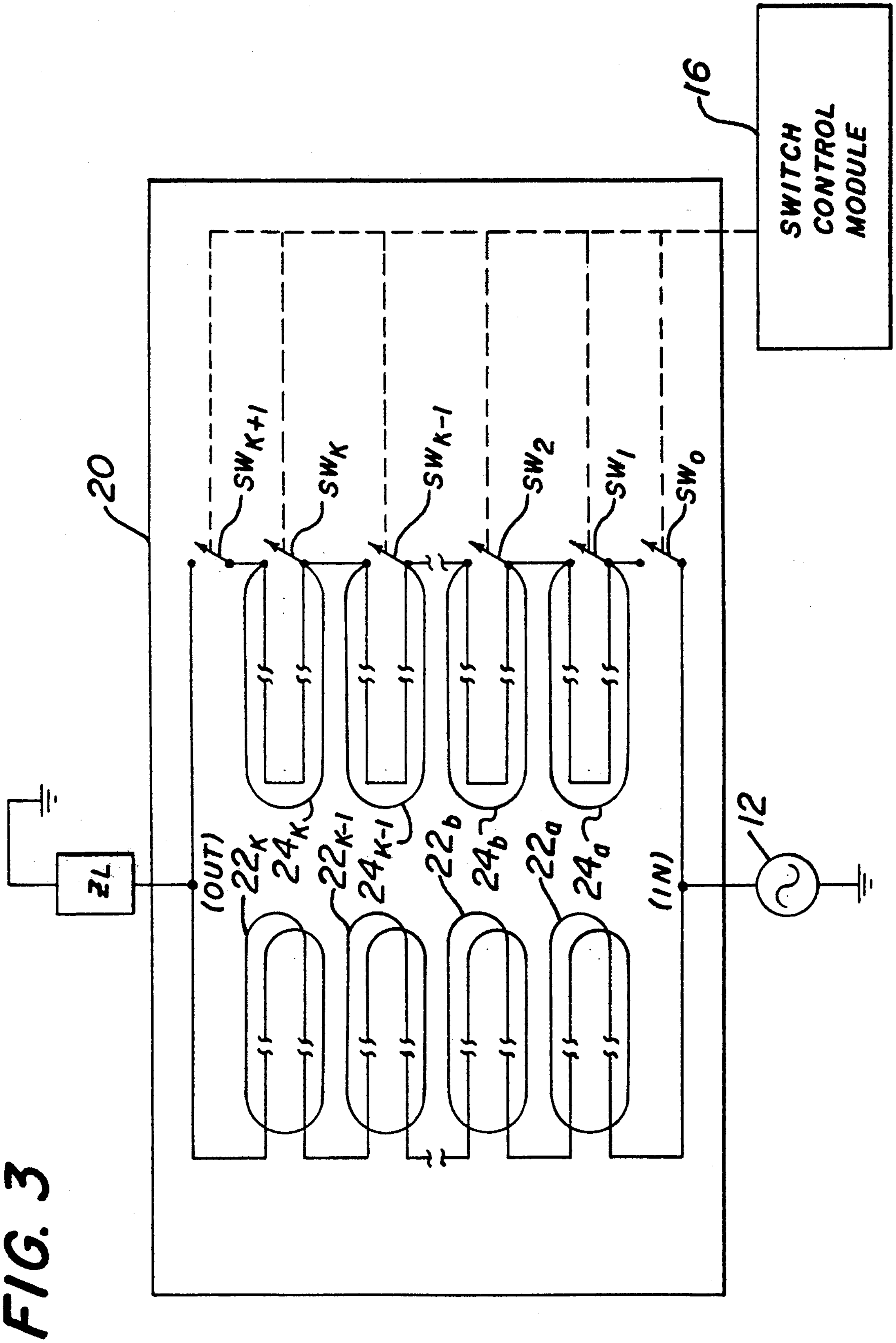
FIG. 3 illustrates the basic principle of a variable-length transmission line (VTL) that may be formed with the impedance matching device of the present invention.
Figure 7:
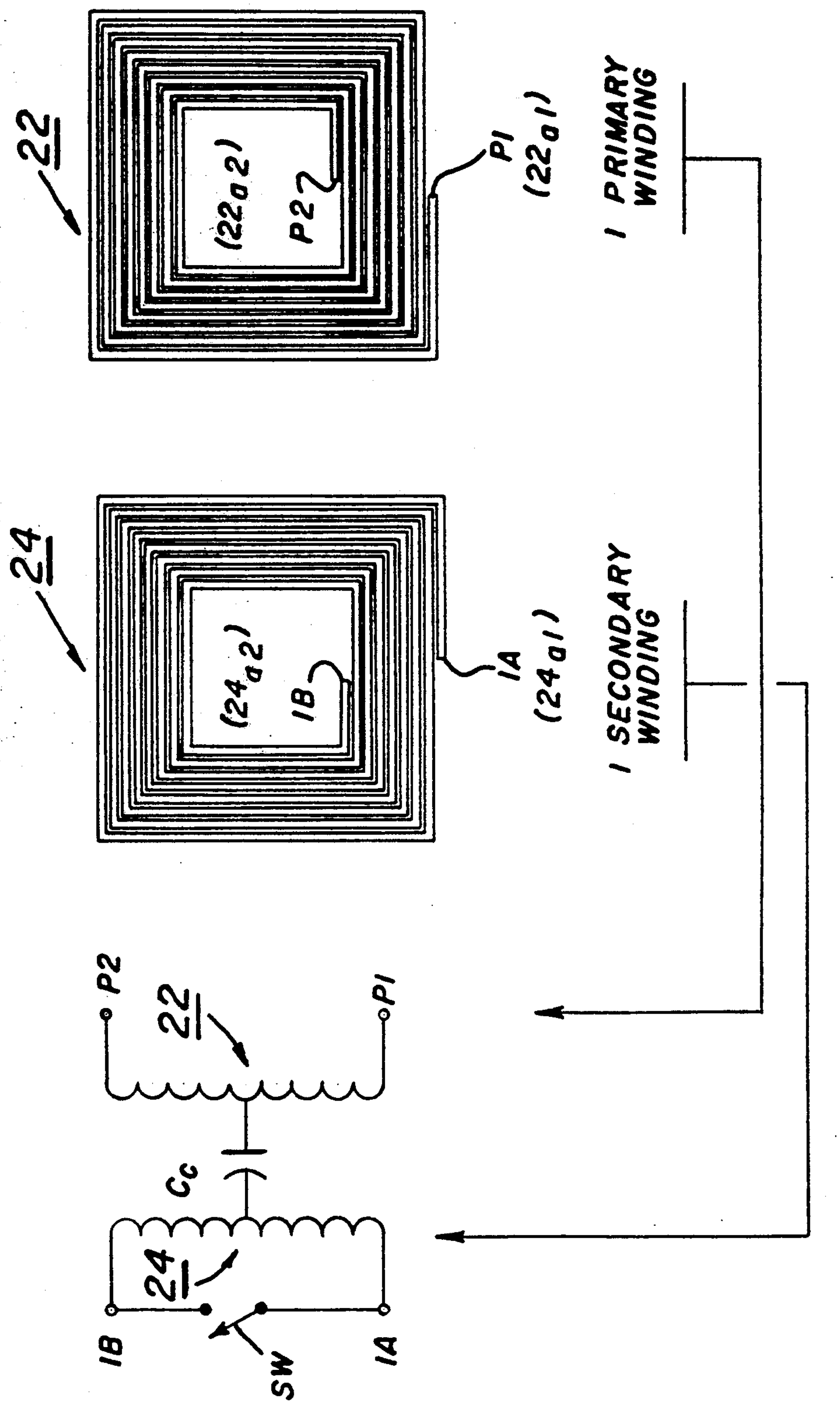
FIG. 7 is a model representation of one of the impedance matching circuits of the present invention.

FIG. 3 illustrates an impedance matching device 20 according to the present invention for providing a predetermined impedance over a frequency range having a lower and an upper band. The impedance device 20 comprises one or more first planar inductive components shown as $22a$, $22b$, . . . $22_{K\text{-}1}$, and $22_K$. FIG. 3 shows the components $22a$, $22_{b1}$, $22_{K\text{-}1}$, and ... $22_K$ as comprised of loops. Each loop may have as many as 7 turns, where $\gamma$ is an integer of at least one (1) or greater. The first planar inductive components $22_a$ . . . $22_K$ are herein termed "primary loops or windings". Each loop of the primary winding $22_a$ . . . $22_K$, consisting of $\gamma$ turns, faces one overlapping large loop (i.e., one turn) of a secondary loop or winding respectively shown in FIG. 3 as $24_a$, $24_b$, $24_{K-1}$, and $24_K$. The winding $24_a$ . . . $24_K$ are also termed herein the "second planar inductive components". The subscript K may be defined as:

$$K=N/\gamma \qquad (1)$$

where N is the number of transmission segment 14 shown in FIG. 2, and 7 is the number of overlapping primary loops ($22_a$ . . . $22_K$) facing a respective secondary loop ($24a$ . . . $24_K$). The first components $22a$, . . . $22_K$ are respectively associated with second components $24a$, . . . $24_K$. Each of the first component $22_a$, . . . $22_K$ and each of the second components $24_a$, . . . $24_K$ have a characteristic impedance selected for matching purposes. The device 20 further comprises a plurality of switch means (SW), shown in FIG. 3 as $SW_0$, $SW_1$, $SW_2$, $SW_{K\text{-}1}$, $SW_K$ and $SW_{K+1}$, each having an active and inactive state and being of a number in which may be expressed as:

$$\mu=K+2 \qquad (2)$$

The first planar components $22a$, $22b$ . . . $22_K$ are connected between the input stage (source 12) and the output stage ($Z_L$) of circuit 20, whereas the second planar components $24a$, $24b$ . . . $24_K$ are preferably connected by a switch $SW_0$ as a group to the input stage and to the output stage by means of switch $SW_{K+1}$. If desired, the second group of components $24_A$, . . . $24_K$ could be connected directly to the input stage and to the output stage so as to reduce the number of switches shown in FIG. 3 by eliminating $SW_0$ and $SW_{K+1}$. The switches $SW_0$, . . . $SW_{K+1}$ shown in FIG. 3 are responsive to the switch control module 16 in a similar manner as described with regard to the circuit arrangement 10 in FIG. 2. The circuit arrangement 20 of FIG. 3 has a reduced number of switches (SW) relative to FIG. 2 and accomplishes such a reduction by means of the compact overlapping arrangement of the first and second planar components which may be described with reference to FIGS. 4, 5, 6 and 7.

The group of second planar inductive components $24_a$, . . . $24_K$ (also referred to herein as the "secondaries") representatively shown as 24 in FIG. 4, comprises a nonconductive substrate 26 on which is mounted a winding 28. In some application the windings are stiff and the substrate 26 is not required. The winding 28 is continuous from a first end $24_{a1}$ to a second end $24_{a2}$. The reference numbers $24_{a1}$ and $24_{a2}$ are used so as to relate the description of this winding 28 to the description of the impedance elements $24_a$, . . . $24_K$ of FIG. 3. The winding 28 is preferably, but need not be, in the form of a printed conductor, such as may be formed by conventional screen printing methods. The winding 28 may also be formed by other methods of forming conductors on substrates, such as etching, vacuum deposition as well as forming a conductor in free space (i.e. machined, molded, cast, electroformed, etc.) and the like without departing from the scope of the invention. Thus, the terms "printing" and "forming" as used herein encompasses and should be understood to include any method of creating a planar conductor. Winding 28 is illustrated as a spiral with a right-angle orientation, but it should be understood that other forms of spirals can be used for winding 28 without departing from the scope of the invention. Likewise, it should be understood that the winding 28 need not be printed, but can be fabricated from a wire, for example, and adhered to the substrate 26 in a suitable manner, such as by an adhesive.

Figure 5:
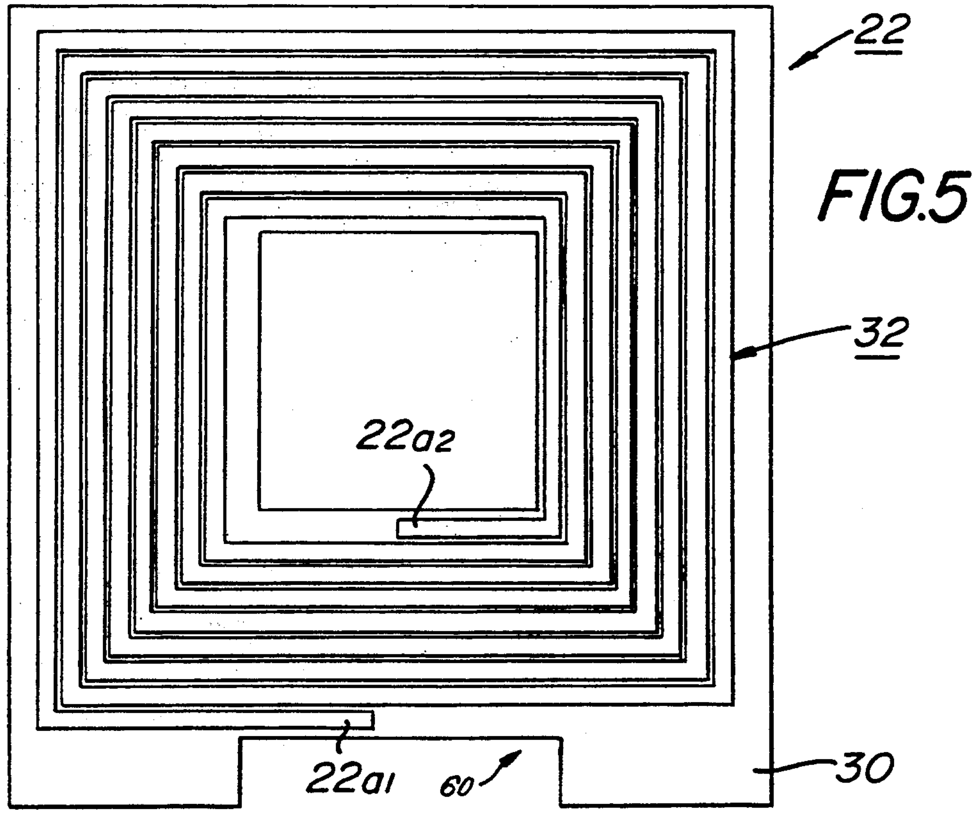
FIG. 5 illustrates a first planar inductive component of an impedance matching circuit according to the invention.

The group of first planar inductive components $22a$, . . . $22_K$ (also referred to herein as the "primaries") representatively shown as 22 in FIG. 5, is preferably, but not necessarily, fabricated in the same method as the winding 28 and comprises a non-conductive substrate 30 on which is mounted a winding 32. The winding 32 may be formed as well in free space without a substrate. In FIG. 5, a single primary winding 32 is shown as having ends $22_{a1}$ and $22_{a2}$. If desired, the first planar inductive component 22, as well as the second planar conductive component 24 may comprise multiple windings as shown in FIG. 6.

Figure 6:
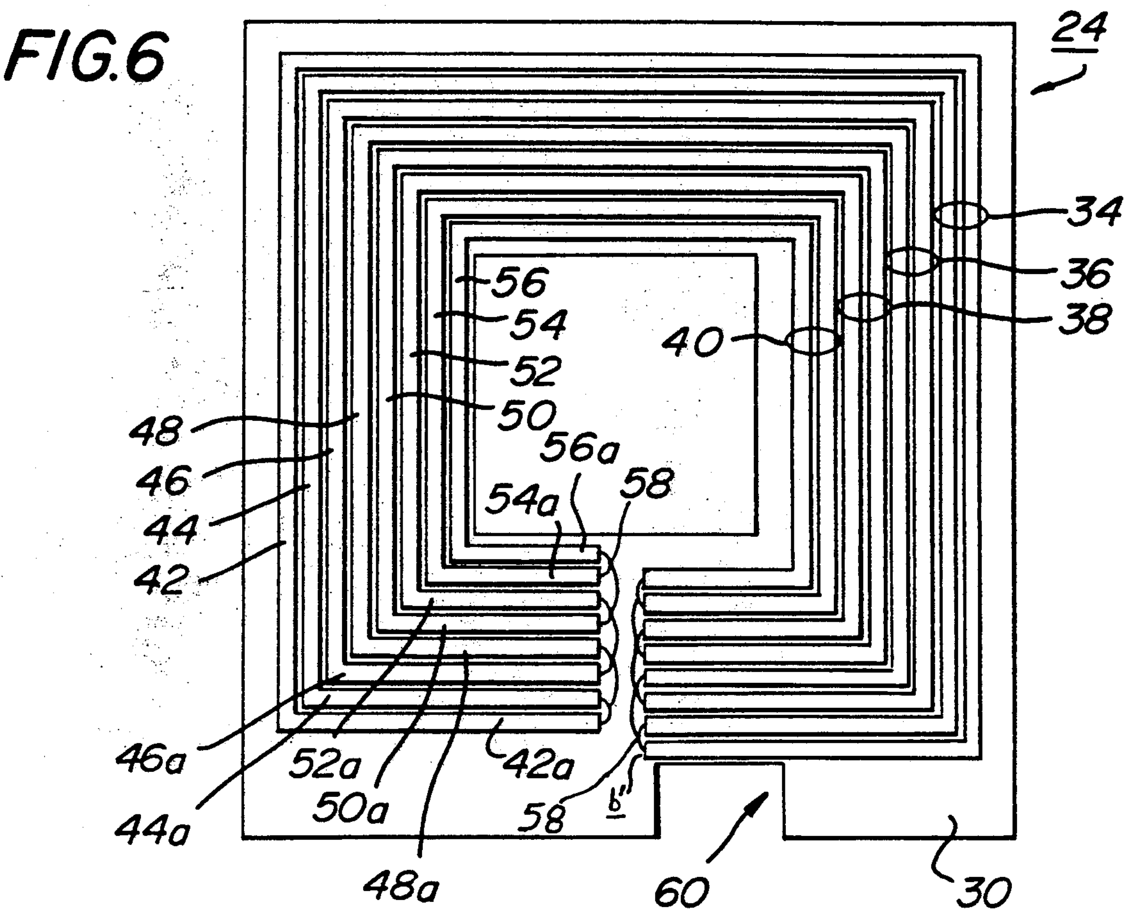
FIG. 6 illustrates another embodiment of the second planar inductive component having multiple windings.

In FIG. 6 showing the second planar component 24, four (4) secondary windings 34, 36, 38 and 40 are illustrated, although it should be understood that the precise number of windings is not critical to the invention. Each of the secondary windings 34, 36, 38 and 40 comprise a pair of conductors, (i.e., $\gamma=2$) labelled 42, 44; 46, 48; 50, 52; and 54, 56 respectively. Each of the conductors 42, 44, 46, 48, 50, 52, 54 and 56 is continuous between a first end a (indicated by an arrow) and a second end b (indicated by an arrow). Ends 42*a*, 44*a*; 46*a*, 48*a*; 50*a*, 52*a*; and 54*a*, 56*a* are electrically connected in pairs that is, 42 with 44, 46 with 48, 50 with 52, and 54 with 56 as are ends 42*b*, 44*b*: 46*b*, 48*b*: 50*b*, 52*b* and 54*b*, 56*b* to define the four secondary windings 34, 36, 38 and 40 respectively. The electrical pairs connections between these windings are illustrated in FIG. 6 by eight (8) jumpers 58.

As described with regard to secondary winding 28, conductors 42, 44, 46, 48, 50, 52, 54 and 56 may be printed or otherwise formed on substrate 30. Likewise, secondary windings 34, 36, 38 and 40 preferably have the "same shape" with mirror image symmetry as the primary winding 32. That is, in the illustrated embodiment of FIGS. 4–6, the secondary windings of FIG. 4 are in the shape of a spiral with right-angle orientations while the primary winding 32 of FIG. 5, has mirror image symmetry and thus shaped as a spiral with left hand orientation.

Although each secondary windings 34, 36, 38 and 40 is shown in FIG. 6 as a pair of conductors, any number of conductors, as required for a given application, can be used to comprise a secondary winding 34, 36, 38 and 40. Similarly, any number of conductors may be used for the primary winding 32 of FIG. 5. Further, although the primary winding is shown in FIG. 5 as comprising a single winding, any number of conductors to form any number of primary windings, as required by a given application, can be used. Further, preferably, although not necessarily, substrate 26 of FIG. 4 and substrate 30 of FIGS. 5 and 6 are each provided with central openings 60 and 59, respectively, for locating the first planar inductive component 22 and the second planar inductive component 24 relative to one another and also relative to external circuitry. Both the first and second components 22 and 24, respectively, are provided with suitable connectors and associated wiring (not shown) to enable them to be connected to other circuits and to other circuit elements for use as an impedance matching circuit. The precise form of connections is immaterial to the present invention.

Figure 4:
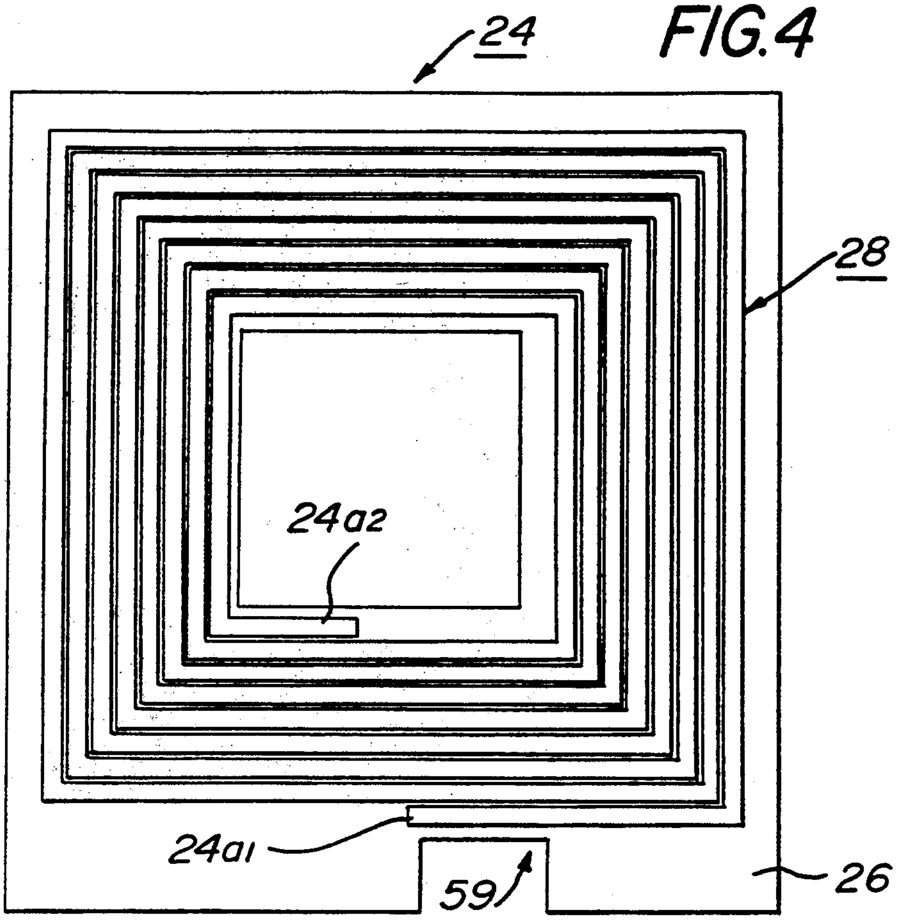
FIG. 4 illustrates a second planar inductive component of an impedance matching circuit according to the invention.

To form the impedance matching device 20 of the present invention, the first planar inductive component 22 and the second planar inductive component 24 are overlapped and arranged a short distance apart from each other with the primary winding 32 and the secondary winding 28 of FIG. 4 or the secondary windings 34, 36, 38 and 40 of FIG. 6 arranged to face each other. In this configuration, the first and second components are referred to as having mirror-image symmetry. A non-conductive spacer means may be used to maintain a fixed distance between the first and second planar components. The spacer means may consist of a single sheet of non-conductive material which has substantially the same surface area as the first component 22 and the second component 24, or may comprise a plurality of smaller individual spacers located at preselected locations. In this arrangement, the first component 22 and the second component 24 are advantageously coupled magnetically (i.e., inductively) and capacitively. When the first component 22 and the second component 24 are arranged facing each other with mirror-image symmetry, they form an impedance matching device according to the present invention. For convenience, the impedance matching device of the present invention will sometimes be referred to herein as a "P-section". The term "P-section" is a coined term and is used as short-hand reference to the planar structure (i.e., P for planar) features of the present invention, and has no significance in the RF and microwave art other than such a reference.

One embodiment of the P-section may modelled as illustrated in FIG. 7. The first planar inductive component 22, having first ($22_{a1}$) and second ($22_{a2}$) ends previously described with reference to FIG. 5, may be envisioned as a primary winding of a transformer, whereas the second planar inductive component 24, having first ($24_{a1}$) and second ($24_{a2}$) ends previously described with reference to FIG. 4, may be envisioned as the secondary winding of the same transformer. For the embodiment illustrated in FIG. 7, the first and the second planar inductive components are illustrated to have substantially the same number of windings, however, it should be recognized that the turns ratio for the first and second planar components may be a number greater than 1. In all such embodiments, since the first planar inductive component 22 and the second planar inductive component 24 face each other, there is both a capacitive $C_c$ and inductive coupling as shown schematically in FIG. 7, between the primary and secondary windings shown schematically as a transformer as well as a capacitor. For ease of reference, the primary terminals are labelled P1 and P2 and the secondary terminals are labelled 1A and 1B. The secondary terminals 1A and 1B are shown to have connected a switch SW across them. The operation of the switch (SW) effects both the primary and secondary windings and is of primary importance of the present invention, and may be further described with reference to FIG. 3.

The switches $SW_1, \ldots SW_K$ are an essential part of the impedance matching device 20 of FIG. 3 and have respective overlapping windings $22_a, \ldots 22_K$ and $24_a, \ldots 24_K$ that provide in effect as many transmission variable segments as compared to the transmission segments $14_1, \ldots 14_N$ of FIG. 2 yet while saving about half of the number of switching. These overlapping sections of FIG. 3 are provided within smaller space compared to the arrangement of FIG. 2. The operation of switches $SW_1, \ldots SW_K$, along with the overlapping windings provides for a reduction in the number of related switches $SW_1, \ldots SW_K$ shown in FIG. 3 relative to those switches shown in FIG. 2. The number of switches (M) needed for the operation of the impedance matching device 20 of FIG. 3, relative to the number of switches needed for the impedance matching device 10 of FIG. 2, may be expressed as:

$$M = N/\gamma + 2 \tag{3}$$

where N is the original number of switches shown in FIG. 2 and $\gamma$ is the number of overlapping "loops" (see expression 1). The quantity 2 in expression (3) corresponds to the preferred switches $SW_0$ and $SW_{K+1}$ shown in FIG. 3.

The switch count reduction realized by the circuit arrangement of FIG. 3 because in operation the current $I_1$ flowing in the primary windings $22a, \ldots 22_K$ of circuit 20 produces a variable magnetic field per Ampere's Law. The resulting magnetic field $\phi_1$ produces a voltage across the corresponding secondary winding $24_a, \ldots 24_K$ generally indicated in FIG. 3. When the corresponding secondary winding $24_a, \ldots 24_K$ is shorted out by the operation of its corresponding switch, e.g., $SW_1$ shorting out $22_a$ both components also generally indicated in FIG. 3, a corresponding current $I_2$ is produced on the secondary winding due to the presence of the magnetic field $\phi_1$. This current $I_2$ creates a secondary magnetic field $\phi_2$ that cancels out $\phi_1$ and therefore acts as if a short was placed immediately across the corresponding primary winding $22_a, \ldots 22_K$. Thus, a single switch such as $SW_1$, or $SW_K$ can short out both the secondary winding $24_a$, or $\ldots 24_K$ and the respective primary winding $22_a$, or $\ldots 22_K$.

The operation of a single switch shorting out the secondary winding and effectively shorting out the primary winding allows for broad band frequency operation. At the lower end of the frequency range, the primary windings $22_a \ldots 22_K$ act as a variable length transmission line and can typically perform over two octaves, wherein each octave is defined as a region between a given frequency f and either twice that frequency (2f) or half that frequency (f/2). Thus, two octaves may be expressed as band of frequencies of f/2 to 2f.

In practice, the coupling between the primary windings $22_a, \ldots 22_K$ and $24_a, \ldots 24_K$ is not perfect and as a result the primary windings $22_a, \ldots 22_K$ experience a parallel resonant condition, acting as an open circuit between the generator 12 and the load $Z_L$, at the higher frequencies of the desired performance band. This parallel resonance is equivalent to a high impedance being imposed between the source 12 and the load $Z_L$. This parallel resonance hinders the desired impedance matching in an original configuration in which the primary windings were not directly connected to the load ($Z_L$). However, it was recognized during the development of this invention that the length of the secondary windings $24_a \ldots 24_K$ can still be adjusted regardless of the parallel resonant condition of the primary windings $22_a \ldots 22_K$. Thus, in the upper band of the desired frequency range, the secondary windings $24_a \ldots 24_K$ perform the impedance matching covering an additional two octaves in the upper band of the frequencies. The obtainable overall frequency band of the impedance matching device 20 may be from f/4 to 4f wherein the primary winding $22_a \ldots 22_K$ supplies the desired characteristic impedance in the lower frequency band from f/4 to f, and the secondary winding $24_a \ldots 24_K$ supplies the desired characteristic impedance in the upper frequency band from f to 4f.

The frequency f is commonly selected to correspond to the frequency of the source 12, which typically has values from 2–32 MHz. However, the frequency f for the device 20 of the present invention may be selected to accommodate any impedance matching function desired for the present invention so as to yield a desired frequency band between four octaves of any selected frequency f. Thus, a broad frequency coverage is obtained by the present invention having a minimum number of electronic switches (see expression (3)), and a compact circuit arrangement (overlapping primary $22_a, \ldots 22_K$ and secondary $24_a, \ldots 24_K$ windings), as described with regard to impedance matching device 20 of FIGS. 3–7.

In addition to providing the reduced number of switches, along with an improved frequency band characteristic, the P-section impedance matching device 20 of the present invention reduces or even eliminates the problems previously discussed in the "Background" with regard to the $\pi$ and T matching circuits. As discussed, the and T sections each has an inductor that may be shorted out for short durations corresponding to some one or more frequencies within the band of frequencies supplied by the source 12 to the load $Z_L$ antenna. This shorting of the inductor may be needed so that $\pi$ or T section provides the proper impedance matching characteristic to the antenna. This high speed shorting generates a high current, e.g., 20 amperes, along with a high voltage, e.g., 10 kV, which create high stress conditions that may cause premature failures of the related solid state switching devices. The device 20 of FIG. 3 (P-section) of the present invention utilizes a magnetic field between the first ($22_a, \ldots 22_K$) and second ($24_a, \ldots 24_K$) planar inductive components to provide its impedance matching so as to transform the load impedance ($Z_L$) into the desired characteristic ($Z_0$). This magnetic field technique does not create the high stress conditions caused by the $\pi$ or T matching circuits.

Figure 8:
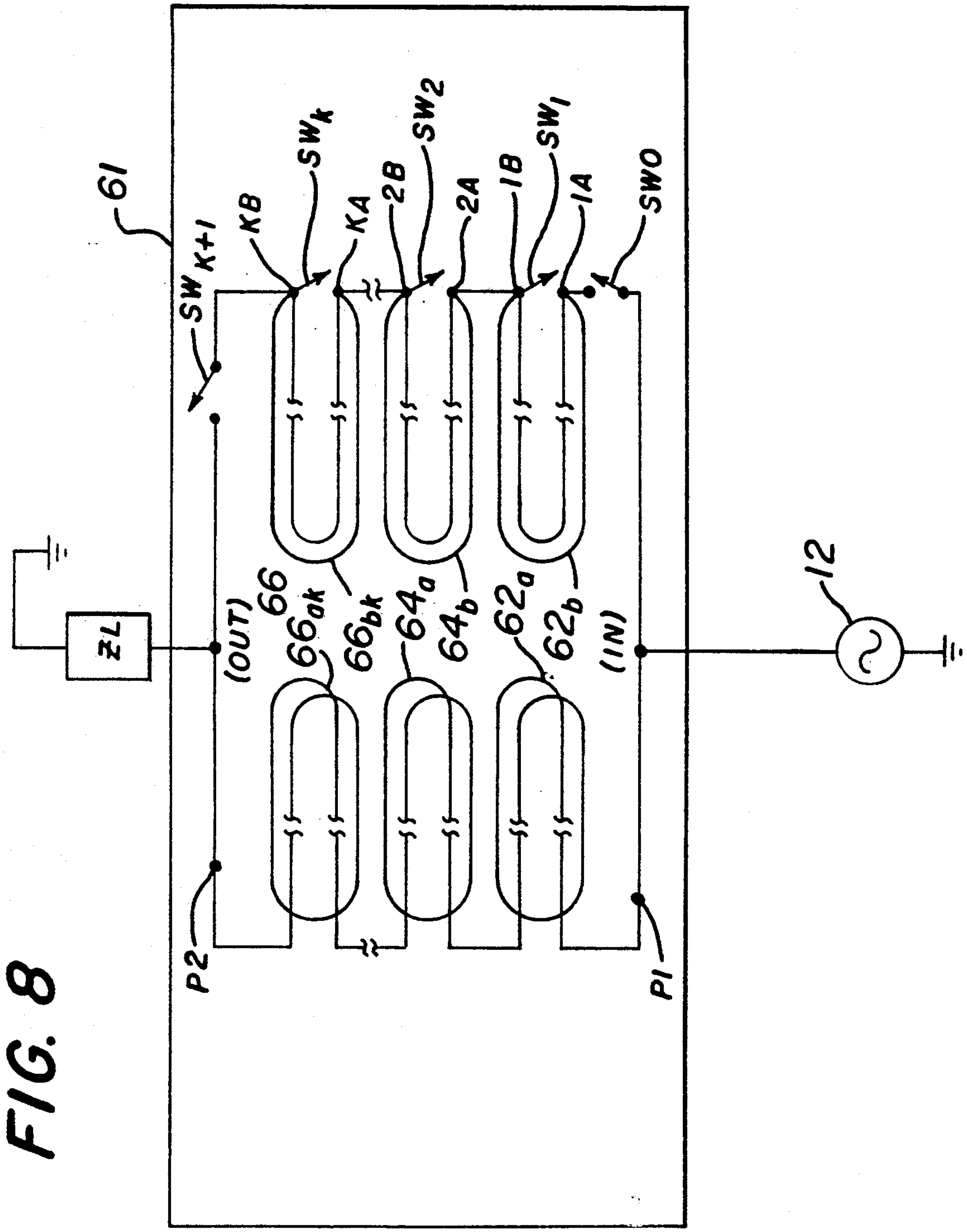
FIG. 8 illustrates an impedance matching device that provides for an extended frequency range suitable for compact rearrangement.

The broad frequency response (f/4 to 4f) of the present invention is obtained by the impedance matching device 61 shown in FIG. 8 as comprising a plurality of sets of first and second planar inductive components which are $62_a$, $62_b$; $64_a$, $64_b$; and $66_{aK}$, $66_{bK}$. The first components $62_a$, $64_a$ and $66_{aK}$ are similar to the first components $22_a \ldots 22_K$ described with reference to FIG. 3, whereas the second components $62_b$, $64_b$ and $66_{bK}$ are similar to $24_a \ldots 24_K$ also of FIG. 3. The first (primary) components $62_a, 64_a, \ldots 66_{aK}$ may be comprised of multiple windings as indicated by the break-lines, shown in FIG. 8, for each set $62_a, 64_a, \ldots 66_{aK}$. Each of the secondary windings $62_b, 64_b, \ldots 66_{bK}$ has a corresponding switching device $SW_1$, $SW_2$, $SW_K$ which operates in a manner as previously described with reference to FIG. 3. The switches $SW_1, SW_2, \ldots SW_K$ are shown as having respective terminals A and B related to the effective shorting of secondary windings $62_b$, $64_b$ and $66_{bK}$. These first and second planar inductive components are segmented and separated from each other into any predetermined number of sets with each set having a predetermined impedance characteristic which is selectable to provide a segment of the overall predetermined impedance over the desired frequency range of operation. The predetermined segment is further subdivided into selectable impedances provided by each of the primary windings $62_a, \ldots 66_{aK}$ and each of the secondary windings $62_b, \ldots 66_{bK}$. This further subdivided feature is equally applicable to the impedance matching device 20 of FIG. 3 along with other embodiments of the invention to be described.

The arrangement of FIG. 8 is similar to FIG. 3 in that the primary windings $62_a$, $64_a$ and $66_{aK}$ are serially connected between the input stage (source 12) and the output stage ($Z_L$). Similarly, the group of secondary primary windings $62_b, 64_b, \ldots 66_{bK}$ are preferably connected to the input stage by means of switch $SW_0$ and to the output stage by switch $SW_{K+1}$. The primary windings $62_a, 64_a, \ldots 66_{aK}$ and their respective secondary windings $62_b$, $64_b$ and $66_{bK}$ operate in the same manner, in response to the corresponding switching means $SW_1 \ldots SW_K$, as discussed with regard to FIG. 3.

Figure 9:
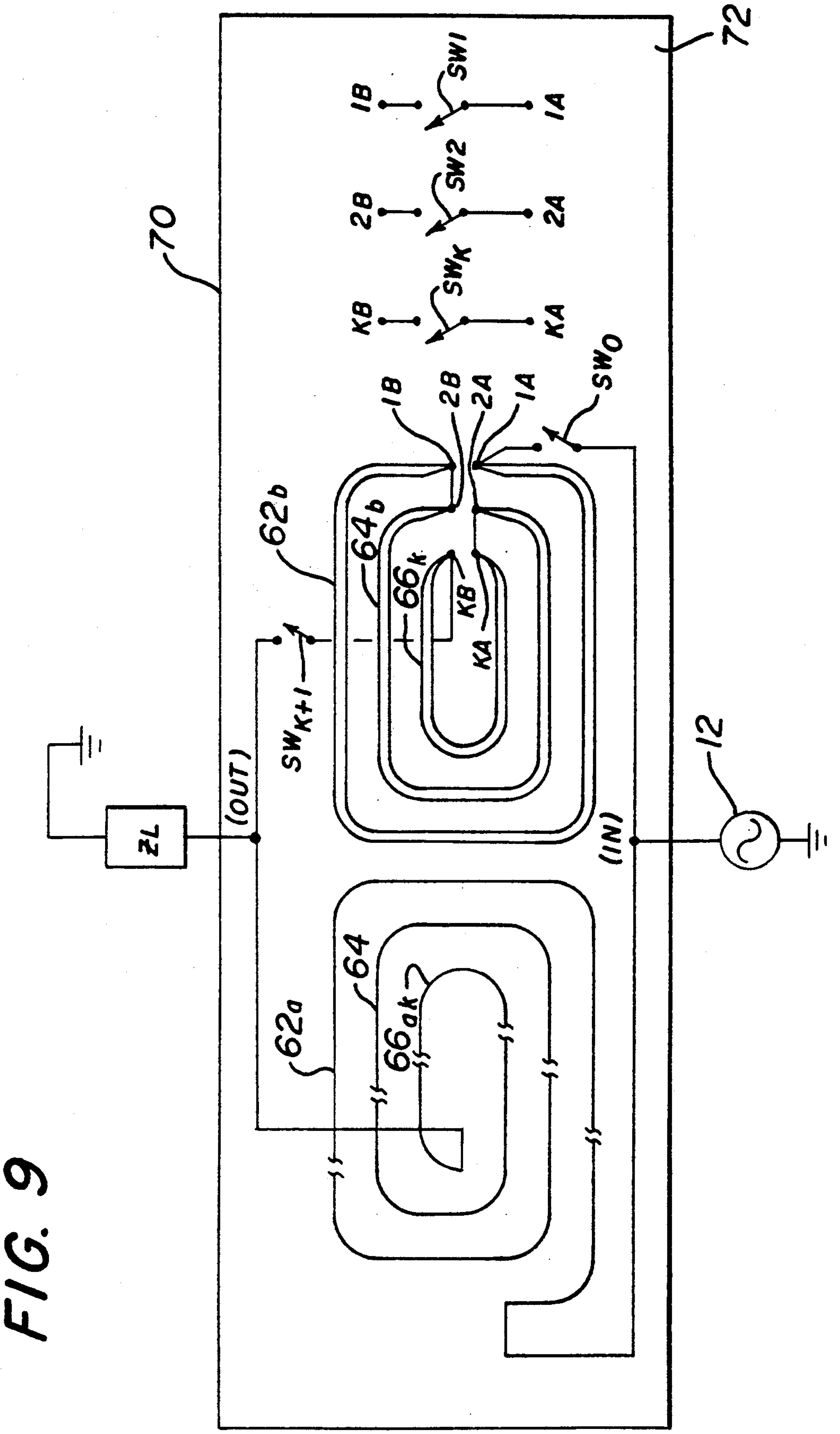
FIG. 9 illustrates the impedance matching device of FIG. 8 arranged in a more compact manner denoted in this invention as a p-section.

A further impedance matching device 70 of the present invention is shown in FIG. 9. The impedance matching device 70 is similar to the previously discussed device 60 with the exception that the sets of the first $62_a$, $64_a$, $66_{aK}$ and second planar $62_b, 64_b, \ldots 66_{bK}$ inductive components are compressed in size compared to FIG. 8 with each set having a closed contour shape. FIG. 9 uses the broken line symbol to indicate that the each of the loops of the first planar component $62_a$, $64_a$ and $66_{aK}$ has $\gamma$ turns which is defined by the previously discussed expression (1). FIG. 9 also illustrates $SW_0$, $SW_1$, $SW_2$, $SW_K$ and $SW_{K+1}$. For the sake of clarity, the switches $SW_1, SW_2, \ldots SW_K$ having their respective illustrated terminals 1A-1B, 2A-2B, and KA-KB are shown away from their related windings $62_b, 64_b, \ldots 66_{bK}$. Further the switch $SW_0$ is shown as being connected between the input (IN) and terminal 1A whereas switch $KW_{K+1}$ is shown as being connected between the output (OUT) and terminal KB. The set $66_{aK}$ and $66_{bK}$ forms an inner closed contour with the sets $64_a$, $64_b$ and $62_a$, $62_b$ having corresponding increasing dimensions to provide increasing closed contour shapes in a fanned-out arrangement.

Figure 10:
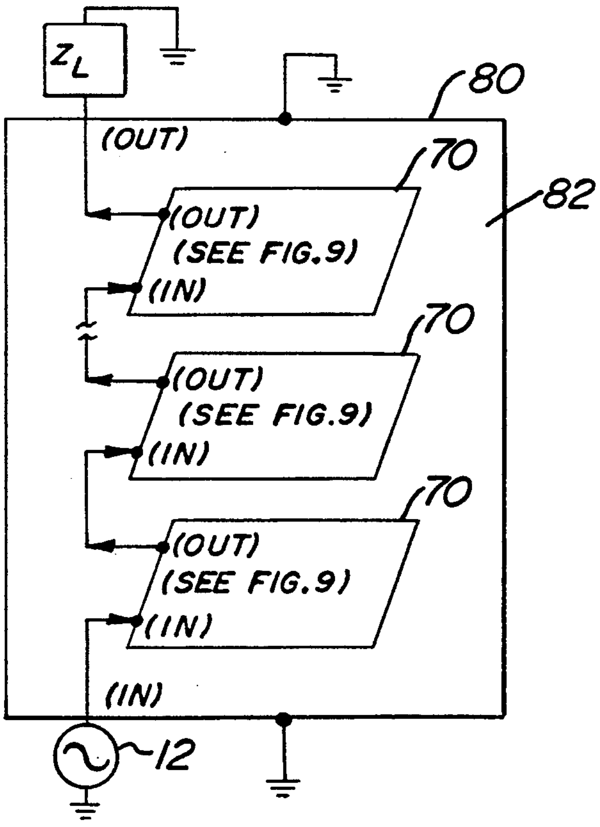
FIG. 10 illustrates cascaded p-section as the impedance matching device of the present invention arranged as a multi-layer stripline arrangement, denoted also as a multi-layer magnetically coupled suspended stripline (MMCSS).

A still further embodiment of the present invention is shown in FIG. 10 for a impedance matching device 80. The device 80 comprises multiple circuit arrangements 70, discussed with regard to FIG. 9, that are connected in cascade and arranged inside of an enclosure 82 which is grounded. Such a planar transmission line enclosed in a grounded enclosure is known as a stripline in the RF microwave art. A stripline that is suspended in air, without the "substantial" use of dielectric material, is also known as a suspended stripline. Thus, device 80 is denoted as multilayer magnetically coupled suspended stripline (MMCSS).

It should now be appreciated that the practice of the present invention provides for an impedance matching device having various embodiments each of which reduces the number of switching elements needed, reduces the stress conditions of the remaining switching elements, and provides for transforming load $Z_L$ into a desired characteristic impedance $Z_0$ over a wide range of high power and high frequency operation.

The present invention may be embodied in other specific forms without departing from the spirit or essential attributes thereof and, accordingly, reference should be made to the appended claims, rather than to the foregoing specification, as indicating the scope of the invention.

I claim:

1. A two port impedance matching device having an input port adapted to be connected to a source of excitation and an output port adapted to be connected to a load impedance $Z_L$, said source having a frequency in the RF region, said impedance matching device presenting to said source a desired characteristic impedance $Z_0$ so that when power is made available at the source, the power is substantially absorbed by said load impedance $Z_L$, said power being made available over a wide frequency band having a center frequency f, said frequency band extending from f/4 to 4f, and having a lower frequency band extending from f/4 to f and a higher frequency band extending from f to 4f, said impedance matching device comprising:

(a) a predetermined number n of first planar inductive components associated with said lower frequency band, each first planar inductive component comprising primary windings, each first planar inductive component having an input end thereof and an output end thereof, and each first planar inductive component having a first unique individual characteristic impedance, each of said primary windings arranged in a spiral path having a center, each of said primary windings disposed in a reference plane, said first planar inductive components being connected in series, the output end of one first planar inductive component being connected to the input end of an adjacent first planar inductive component, said first planar inductive components being arranged into a first group having an initial planar inductive component with the input end thereof comprising an initial end of said first group connected to said input port and a final planar inductive component with the output end comprising a final end of said first group connected to said output port;

(b) a predetermined number m of second planar inductive components associated with said higher frequency band, each second planar inductive component comprising secondary windings, each second planar inductive component having an input end thereof and an output end thereof, and each second planar inductive component having a second unique individual characteristic impedance, each of said secondary windings arranged in a spiral path having a center, each of said secondary windings disposed in a reference plane, said second planar inductive components being connected in series, the output end of one second planar inductive component being connected to the input end of an adjacent second planar inductive component, said second planar inductive component being arranged into a second group having an initial planar inductive component with the input end thereof comprising an initial end of said second group electrically coupled to said input port and a final planar inductive component with the output end thereof comprising a final end of said second group electrically coupled to said output port, said first and second inductive components being arranged in corresponding pairs with each respective primary and secondary winding of each corresponding pair being arranged relative to one another so as to be overlapping and facing one another and so as to have mirror-image symmetry across each other's said reference planes, each pair of said mirror-symmetry arranged first and second planar inductive components being separated from each other by non-conductive spacer means and being magnetically and capacitively coupled to each other; and (c) a predetermined number p of switch means, each switch means being responsive to an externally generated signal and characterized by a high impedance state and a low impedance state, each of said switch means being rendered conductive in response to said externally generated signal for causing the switch means to attain its low impedance state, each of said switch means being connected across the input and output ends of a corresponding second planar inductive component in a manner that when the switch means attains its low impedance state, said switch means shorts out the corresponding said second planar inductive component connected thereto and also effectively shorts out the corresponding first planar inductive component of the mirror-symmetry arranged pair.

2. A two port impedance matching device according to claim 1, wherein a predetermined number p of semiconductor devices comprises said p switch means, and wherein when power is made available at said source it has high power levels exceeding 1 Kw and produces high voltage transients in excess of 10 Kv and high current transients as high as 20 amperes, said first and second planar components being coupled to each other and comprising means for transferring said power of such source when made available and having high power levels exceeding 1 Kw to said load so as to reduce the high voltage and high current transients that might otherwise occur when said semiconductor devices are being responsive to said externally generated signal.

3. A two port impedance matching circuit arrangement according to claim 1, wherein said respective first and second planar inductive components are segmented and separated from each other into a predetermined number of sets, said sets being located in a grounded enclosure, each set of said first planar inductive components being situated on one planar surface comprising one substrate and each set of said second planar inductive components being situated on another planar surface comprising another substrate, said one substrate and said another substrate being separated by said non-conductive spacer means, said enclosed sets serving as a stripline impedance matching device.

4. A two port impedance matching circuit according to claim 1, wherein said p switch means includes an initial entry switch means and a final exit switch means, said initial entry switch means serially connected between said input port and each of said initial ends of said first and second groups of first and second planar inductive components, and said final exit switch means serially connected between said output port and said final end of said first and second groups of first and second planar inductive components.

5. A circuit arrangement for impedance matching having an input port adapted to be connected to a source of excitation and an output port adapted to be connected to a load impedance $Z_L$, said source having a frequency in the RF region, said impedance matching circuit presenting to said source a predetermined impedance when said source is active and providing excitation signals over a wide frequency band having a center frequency f, said frequency band extending from f/4 to 4f and having a lower frequency band extending form f/4 to f and a higher frequency band extending from f to 4f, said circuit arrangement comprising:

(a) a predetermined number n of first planar inductive components each comprising primary windings, each first planar inductive component having an input end thereof and an output end thereof, and each first planar inductive component having a first unique individual characteristic impedance, each of said primary windings arranged in a spiral path having a center, each of said primary windings disposed in a reference plane, said first planar inductive components being connected in series, the output end of one first planar inductive component being connected to the input end of an adjacent first planar inductive component, said first planar inductive components being arranged into a first group having an initial planar inductive component with the input end thereof comprising an initial end of said first group connected to said input port and a final planar inductive component with the output end thereof comprising a final end of said first group connected to said output port;

(b) a predetermined number m of second planar inductive components each comprising secondary windings, each second planar inductive component having an input end thereof and an output end thereof, and each secondary inductive planar component having a second unique individual characteristic impedance, each of said secondary windings arranged in a spiral path having a center, each of said secondary windings disposed in a reference plane, said second planar inductive components being connected in series, the output end of one second planar inductive component being connected to the input end of an adjacent second planar inductive component, said second planar inductive components being arranged into a second group having an initial planar inductive component with an input first end thereof comprising an initial end of said second group connected to said input port and a final planar inductive component with the output end thereof comprising a final end of said second group connected to said output port, said first and second inductive components being arranged in corresponding pairs with each respective primary and secondary winding of each corresponding pair being arranged relative to one another so as to be overlapping and facing one another and so as to have mirror-image symmetry across each other's said reference planes, each pair of said mirror-symmetry arranged first and second planar inductive components being separated from each other by non-conductive spacer means and being magnetically and capacitively coupled to each other; and (c) a predetermined number p of switch means, each switch means being responsive to an externally generated signal and characterized by a high and a low impedance state, each of said switch means being rendered conductive in response to said externally generated signal for causing the switch means to attain its low impedance state, each switch means being connected across the input and output ends of a corresponding second planar inductive component in a manner that when the switch means attains its low impedance state, said switch means selectively shorts out said corresponding second planar inductive components connected thereto while at the same time said corresponding switch means also effectively shorts out the corresponding first planar inductive components of the mirror symmetry arranged pairs;

(d) wherein said arrangement of said first planar inductive components provides a controllable impedance transformation at said lower frequency band and said arrangement of second planar inductive components provides a controllable impedance transformation at said higher frequency band in response to the state of the switch means, said switch means being switched to the low impedance state in response to said externally generated signal.

6. An impedance matching circuit adapted to be connected between a source of excitation and a load impedance $Z_L$ impedance, said source having a frequency in the RF region, said impedance matching circuit presenting to said source a desired characteristic impedance $Z_0$ so that power made available from said source is substantially absorbed by said load impedance $Z_L$, said power being made available over a wide frequency band having a center frequency f, said frequency band extending from f/4 to 4f, and having a lower frequency band extending form f/4 to f and a higher frequency band extending from f to 4f, said impedance matching circuit comprising a plurality of two port devices connected in cascade between said source and said load impedance $Z_L$, each of said two port devices comprising:

(a) a predetermined number n of first planar inductive components associated with said lower frequency band, each first planar inductive component comprising primary windings, each first planar inductive component having an input end thereof and an output end thereof, and each first planar inductive component having a first unique individual characteristic impedance, each of said primary windings arranged in a spiral path having a center, each of said primary windings disposed in a reference plane, said first planar inductive components being connected in series, the output end of one first planar inductive component being connected to the input end of an adjacent first planar inductive component;

(i) said first planar inductive components of said plurality of two port devices being arranged into a first group having an initial planar inductive component with the input end thereof comprising an initial end of said plurality of two port devices connected to said service and a final planar inductive component with the output end thereof comprising a final end of said plurality of two port devices connected to said load impedance $Z_L$;

(b) a predetermined number m of second planar inductive components associated with said higher frequency band, each second planar inductive component secondary windings, each second planar inductive component having an input end thereof and an output end thereof, and each second planar inductive component having a second unique individual characteristic impedance, each of said secondary windings arranged in a spiral path having a center, each of said secondary windings disposed in a reference plane, said second planar inductive components being connected in series, the output end of one second planar inductive component being connected to the input end of an adjacent second planar inductive component, (i) said second planar inductive components of said plurality of two port devices being arranged into a second group having an initial planar inductive component with the input end thereof comprising an initial end of said plurality of two port devices connected to said source and a final planar inductive component with the output end comprising a final end of said plurality of two port devices connected to said load impedance $Z_L$;

said first and second inductive components being arranged in corresponding pairs with each respective primary and secondary winding of each corresponding pair being arranged relative to one another across each other's said reference planes so as to be overlapping and facing one another and so as to have mirror-image symmetry, each pair of said mirror-symmetry arranged first and second planar inductive components being separated from each other by non-conductive spacer means and being magnetically and capacitively coupled to each other; and (c) a predetermined number p of switch means, each switch means being responsive to an externally generated signal and characterized by a high impedance state and a low impedance state, each of said switch means being rendered conductive in response to said externally generated signal for causing the switch means to attain the low impedance state, each of said switch means being connected across the input and output ends of a corresponding second planar inductive component in a manner that when the switch means attains its low impedance state, said switch means shorts out the corresponding said second planar inductive component connected thereto and also effectively shorts out the corresponding first planar inductive component of the mirror-symmetry arranged pair.

* * * * *